United States Patent
Takeuchi et al.

(10) Patent No.: US 10,782,359 B2
(45) Date of Patent: Sep. 22, 2020

(54) LEAKAGE CURRENT CALCULATION DEVICE AND LEAKAGE CURRENT CALCULATION METHOD

(71) Applicant: OMRON Corporation, Kyoto (JP)

(72) Inventors: Tsuyoshi Takeuchi, Aso (JP); Takanori Kuwahara, Kumamoto (JP)

(73) Assignee: OMRON Corporation, Kyoto (JP)

( * ) Notice: Subject to any disclaimer, the term of this patent is extended or adjusted under 35 U.S.C. 154(b) by 315 days.

(21) Appl. No.: 15/751,468

(22) PCT Filed: Nov. 21, 2016

(86) PCT No.: PCT/JP2016/084416
§ 371 (c)(1),
(2) Date: Feb. 8, 2018

(87) PCT Pub. No.: WO2017/154271
PCT Pub. Date: Sep. 14, 2017

(65) Prior Publication Data
US 2020/0200832 A1   Jun. 25, 2020

(30) Foreign Application Priority Data

Mar. 9, 2016 (JP) ................................ 2016-046127

(51) Int. Cl.
*G01R 27/18* (2006.01)
*G01R 31/52* (2020.01)
(Continued)

(52) U.S. Cl.
CPC ....... *G01R 31/52* (2020.01); *G01R 19/16528* (2013.01); *G01R 27/025* (2013.01); *G01R 31/343* (2013.01)

(58) Field of Classification Search
CPC  G01R 31/52; G01R 19/16528; G01R 27/025; G01R 31/343
(Continued)

(56) References Cited

U.S. PATENT DOCUMENTS

| 6,421,618 B1* | 7/2002 | Kliman | G01R 31/50 702/58 |
| 2008/0165462 A1* | 7/2008 | Atoji | G01R 31/52 361/87 |

(Continued)

FOREIGN PATENT DOCUMENTS

| CN | 2502278 | 7/2002 |
| CN | 1963539 | 5/2007 |

(Continued)

OTHER PUBLICATIONS

"Search Report of Europe Counterpart Application", dated Nov. 12, 2019, p. 1-p. 6.

(Continued)

*Primary Examiner* — Farhana A Hoque
*Assistant Examiner* — Courtney G McDonnough
(74) *Attorney, Agent, or Firm* — JCIPRNET

(57) ABSTRACT

A resistance leakage current calculating part calculates an insulation resistance-to-ground leakage current corresponding to a system frequency of a commercial power system, which flows through an insulation resistance-to-ground of a three-phase motor between the three-phase motor and the ground on the basis of a center of a circle which is described by specific points which are specified by a leakage current component and a phase difference which are extracted and calculated at three or more different time points. Accordingly, when the system frequency of the commercial power system and an operating frequency of an inverter device are the same, it is possible to accurately calculate an insulation (Continued)

resistance-to-ground leakage current corresponding to the system frequency.

20 Claims, 13 Drawing Sheets

(51) Int. Cl.
G01R 27/02 (2006.01)
G01R 19/165 (2006.01)
G01R 31/34 (2020.01)

(58) Field of Classification Search
USPC .......................................................... 324/509
See application file for complete search history.

(56) References Cited

U.S. PATENT DOCUMENTS

2016/0124038 A1* 5/2016 Matsushita ............. G01R 31/50
                                                             324/510
2017/0307675 A1* 10/2017 Matsushita ............. G01R 31/50

FOREIGN PATENT DOCUMENTS

| CN | 101271130 | 9/2008 |
|---|---|---|
| CN | 102739066 | 10/2012 |
| EP | 1277060 | 12/2005 |
| JP | 2001352663 | 12/2001 |
| JP | 2007114190 | 5/2007 |
| JP | 2011-153910 | 8/2011 |
| JP | 2012251817 | 12/2012 |
| JP | 2013170961 | 9/2013 |
| JP | 2013195093 | 9/2013 |
| JP | 5631444 | 11/2014 |
| JP | 2014-228519 | 12/2014 |
| JP | 5770903 | 8/2015 |
| WO | 2006035519 | 4/2006 |
| WO | 2015076075 | 5/2015 |

OTHER PUBLICATIONS

"Office Action of Japan Counterpart Application" with English translation thereof, dated Aug. 28, 2018, p. 1-p. 6.

"International Search Report (Form PCT/ISA/210) of PCT/JP2016/084416," dated Feb. 14, 2017, with English translation thereof, pp. 1-4.

"Written Opinion of the International Searching Authority (Form PCT/ISA/237) of PCT/JP2016/084416," dated Feb. 14, 2017, with English translation thereof, pp. 1-6.

"Office Action of Korea Counterpart Application", dated Jan. 11, 2019, with English translation thereof, p. 1-p. 6.

"Office Action of China Counterpart Application", dated Jul. 24, 2019, with English translation thereof, p. 1-p. 11.

Li Cong, et al., "Analytical modeling of asymmetric HALO-doped surrounding-gate MOSFET with gate overlapped lightly-doped drain," Acta Physica Sinica, vol. 61, Apr. 2012, pp. 1-8.

"Office Action of India Counterpart Application", dated Jun. 22, 2020, p. 1-p. 5.

* cited by examiner

LEAKAGE CURRENT CALCULATION DEVICE AND LEAKAGE CURRENT CALCULATION METHOD

CROSS-REFERENCE TO RELATED APPLICATION

This application is a 371 application of the International PCT application serial no. PCT/JP2016/084416, filed on Nov. 21, 2016, which claims the priority benefits of Japan Patent Application No. 2016-046127, filed on Mar. 9, 2016. The entirety of the above-mentioned patent application is hereby incorporated by reference herein and made a part of this specification.

TECHNICAL FIELD

The invention relates to a leakage current calculation device and a leakage current calculation method that calculates a leakage current.

BACKGROUND ART

As an example of technology of calculating a leakage current in a load of a three-phase motor or the like, a leakage current calculation device that calculates a value of a leakage current flowing through an insulation resistance-to-ground component other than a capacitance-to-ground component of the three-phase motor in a leakage current-to-ground by integrating a zero-phase current component in a frequency band in a period corresponding to zero-crossings of a basic AC frequency waveform is disclosed in Patent Literature 1.

CITATION LIST

Patent Literature

Patent Literature 1

Japanese Unexamined Patent Application Publication No. 2014-228519 (published on Dec. 8, 2014)

SUMMARY OF INVENTION

Technical Problem

The leakage current calculation device of Patent Literature 1 can accurately calculate a leakage current flowing through an insulation resistance-to-ground component when a frequency of a commercial power system and an operating frequency of an inverter device are set to difference values. However, when the frequency of the commercial power system and the operating frequency of the inverter device are set to the same value, there is concern that an error will occur in the calculated leakage current.

The invention is made to solve the above-mentioned problem and an object thereof is to provide a leakage current calculation device and a leakage current calculation method that can accurately calculate an insulation resistance-to-ground leakage current corresponding to a system frequency when the system frequency of a commercial power system and an operating frequency of an inverter device are the same.

Solution to Problem

In order to solve the above-mentioned problem, a leakage current calculation device according to an aspect of the invention includes: a voltage measuring part that measures at least one of line voltages on an input side of an inverter with a three-phase AC commercial power system, in which any of three different phases is grounded, as a power source; a voltage-to-ground calculating part that calculates a voltage-to-ground between a neutral point of the commercial power system and the ground from the at least one line voltage measured by the voltage measuring part; a leakage current measuring part that measures a leakage current flowing between a load connected to an output side of the inverter and the ground; a frequency component extracting part that extracts a leakage current component synchronized with a system frequency of the commercial power system from the measured leakage current; a phase difference determining part that determines a phase difference between the calculated voltage-to-ground and the extracted leakage current component; and a leakage current calculating part that calculates an insulation resistance-to-ground leakage current corresponding to the system frequency, which flows through an insulation resistance-to-ground of the load between the load and the ground on the basis of a center of a circle which is described by specific points which are specified by the leakage current component extracted and the phase difference determined at three or more different time points.

In order to achieve the above-mentioned object, a leakage current calculation method according to another aspect of the invention includes: a voltage measuring step of measuring at least one of line voltages on an input side of an inverter with a three-phase AC commercial power system, in which one of three different phases is grounded, as a power source; a voltage-to-ground calculating step of calculating a voltage-to-ground between a neutral point of the commercial power system and the ground from the measured at least one line voltage; a leakage current measuring step of measuring a leakage current flowing between a load connected to an output side of the inverter and the ground; a frequency component extracting step of extracting a leakage current component synchronized with a system frequency of the commercial power system from the measured leakage current; a phase difference determining step of determining a phase difference between the calculated voltage-to-ground and the extracted leakage current component; and a leakage current calculating step of calculating an insulation resistance-to-ground leakage current corresponding to the system frequency, which flows through an insulation resistance-to-ground of the load between the load and the ground on the basis of a center of a circle which is described by specific points which are specified by the leakage current component and the phase difference which are extracted and determined at three or more different time points.

Advantageous Effects

According to the invention, it is possible to accurately calculate an insulation resistance-to-ground leakage current corresponding to a system frequency when the system frequency of a commercial power system and an operating frequency of an inverter device are the same.

FIRST EMBODIMENT

A first embodiment of the invention will be described below with reference to FIGS. 1 to 11B.

Example of Configuration

Figure 2:
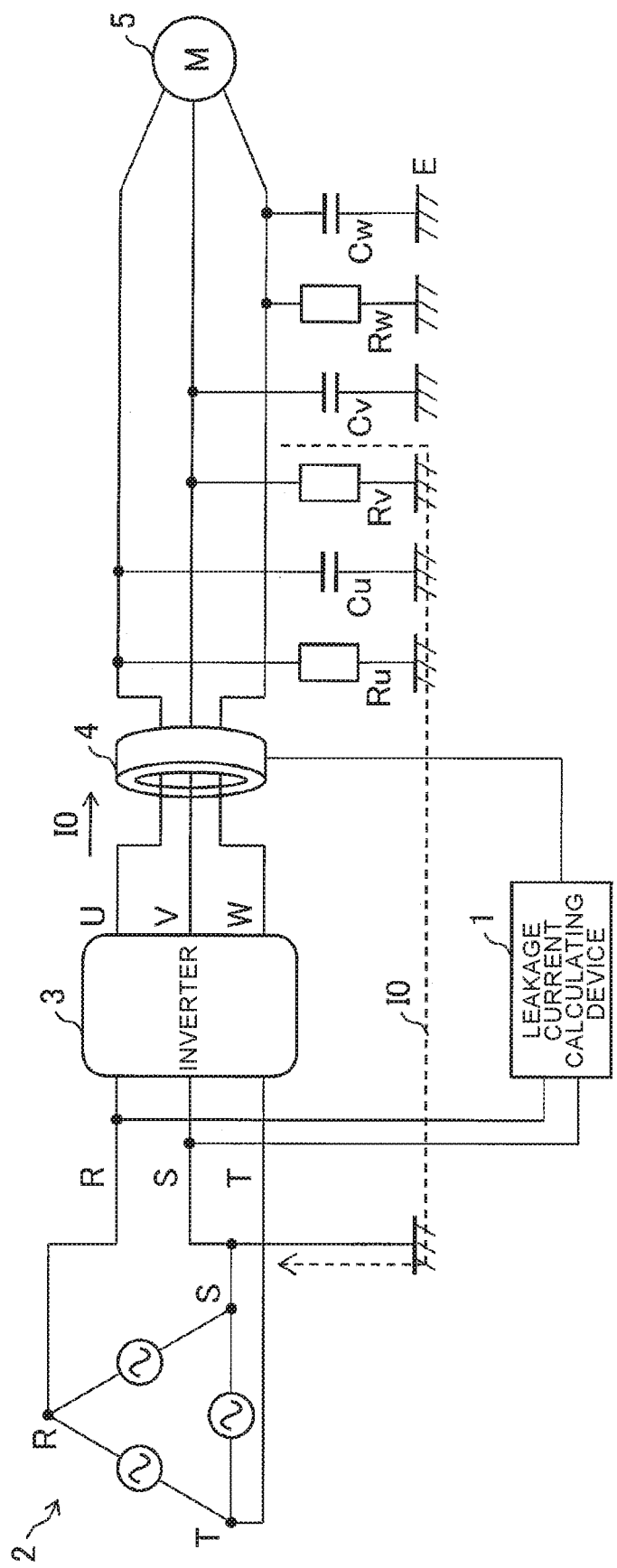
FIG. 2 is a system diagram schematically illustrating a configuration example in which the leakage current calculation device according to the first embodiment of the invention is employed.

FIG. 2 is a system diagram schematically illustrating a configuration example in which a leakage current calculation device 1 according to the first embodiment of the invention is employed. In the example illustrated in the drawing, the leakage current calculation device 1 is configured to monitor a three-phase motor 5 (a load) such as a servomotor which is driven by an inverter 3 with a commercial power system 2 as a power source.

The commercial power system 2 is a three-phase alternating type AC power source in which an S phase of three different phases (an R phase, an S phase, and a T phase) is grounded to the ground E. The three phases are respectively connected to an input side of the inverter 3 via an R line, an S line, and a T line.

The inverter 3 generates predetermined control voltages from three-phase electric power supplied from the commercial power system 2 and outputs the control voltages to the three-phase motor 5 respectively via three lines (a U line, a V line, and a W line) corresponding to three phases (a U phase, a V phase, and a W phase) on an output side. The three-phase motor 5 is connected to the output side of the inverter 3 and operates using the supplied control voltages.

A zero-phase current transformer 4 surrounding the U line, the V line, and the W line is provided between the inverter 3 and the three-phase motor 5. The zero-phase current transformer 4 measures a combined zero-phase current I0 of three phases flowing between the inverter 3 and the three-phase motor 5. Although details thereof will be described later, the zero-phase current I0 is equal to a leakage current flowing between the three-phase motor 5 and the ground E.

Configuration of Leakage Current Calculation Device 1

Figure 1:
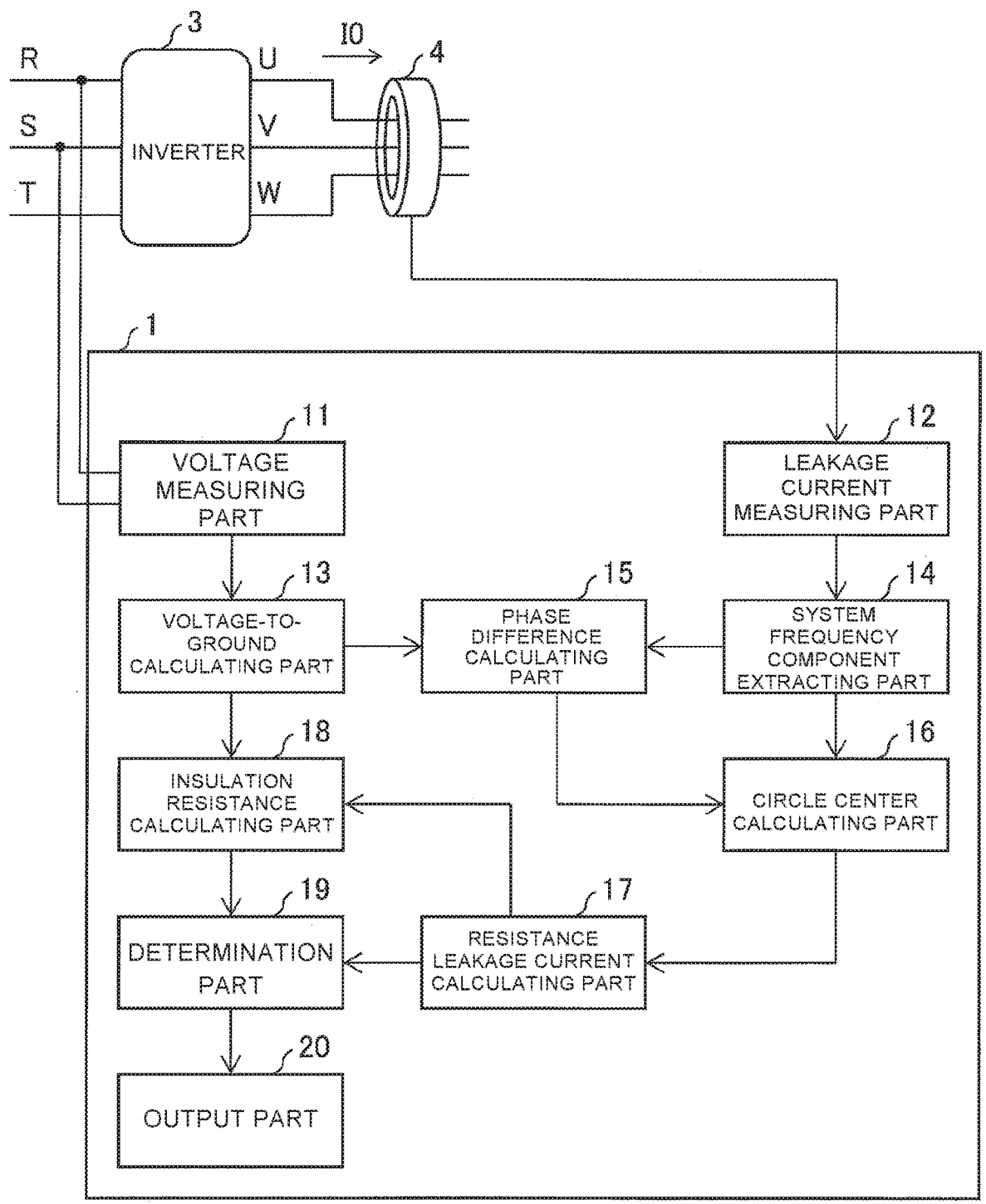
FIG. 1 is a block diagram illustrating a configuration of principal parts of a leakage current calculation device according to a first embodiment of the invention.

FIG. 1 is a block diagram illustrating a configuration of principal parts of the leakage current calculation device according to the first embodiment of the invention. As illustrated in the drawing, the leakage current calculation device 1 includes a voltage measuring part 11, a leakage current measuring part 12, a voltage-to-ground calculating part 13, a system frequency component extracting part 14 (a frequency component extracting part), a phase difference calculating part 15 (a phase difference determining part), a circle center calculating part 16, a resistance leakage current calculating part 17 (a leakage current calculating part), an insulation resistance calculating part 18, a determination part 19 (an insulation-deteriorated load specifying part and an insulation deterioration determining part), and an output part 20.

The voltage measuring part 11 measures at least one of line voltages on an input side of the inverter 3. In this embodiment, the line voltage between the R phase and the S phase on the input side of the inverter 3 is measured. The line voltage to be measured is not limited thereto, and an arbitrary line voltage can be measured. For example, the voltage measuring part 11 may measure a voltage between the R phase and the T phase or a voltage between the T phase and the S phase. The voltage measuring part 11 may include a low-pass filter or a band-pass filter for removing a high-frequency component from the measured voltage or extracting a system frequency component from the measured voltage.

The voltage-to-ground calculating part 13 calculates a voltage-to-ground between a neutral point of the commercial power system 2 and the ground E from at least one of the line voltages measured by the voltage measuring part 11. In this embodiment, the voltage-to-ground is calculated from the line voltage between the R line and the S line.

The leakage current measuring part 12 measures a leakage current (a zero-phase current) flowing between the three-phase motor 5 and the ground E using the zero-phase current transformer 4. The leakage current measuring part 12 may include a low-pass filter or a band-pass filter for removing a high-frequency component from the measured leakage current or extracting a system frequency component from the measured leakage current.

The system frequency component extracting part 14 extracts a leakage current component synchronized with the system frequency of the commercial power system 2 (that is, a leakage current component of the same frequency as the system frequency) from the measured leakage current. For example, discrete Fourier transform (DFT) or fast Fourier transform (FFT) may be used for the extraction process.

The phase difference calculating part 15 calculates a phase difference between the calculated voltage-to-ground and the extracted leakage current component. The calculation of the phase difference is performed, for example, by a computing process, but the phase difference may be determined by measuring a phase difference using a predetermined measurement circuit instead.

The circle center calculating part 16 calculates a center of a circle which is described by points (specific points) specified by the leakage current components calculated and the phase differences determined at three or more different time points.

The resistance leakage current calculating part 17 calculates a current (an insulation resistance-to-ground leakage current corresponding to the system frequency) flowing through an insulation resistance-to-ground of the three-phase motor 5 between the three-phase motor 5 and the ground E on the basis of the calculated center of the circle.

The insulation resistance calculating part 18 calculates the insulation resistance-to-ground of the three-phase motor 5 using the calculated insulation resistance-to-ground leakage current corresponding to the system frequency and the calculated voltage-to-ground.

The determination part 19 determines whether insulation failure (insulation deterioration) has occurred in the three-phase motor 5 on the basis of the calculated insulation resistance-to-ground leakage current corresponding to the system frequency or the calculated insulation resistance-to-ground.

The output part 20 outputs the determination result of insulation failure outside the leakage current calculation device 1 in a desired format. This output is performed, for example, by screen display, communication output, or contact signal output.

Calculation of Voltage-To-Ground

Figure 3:
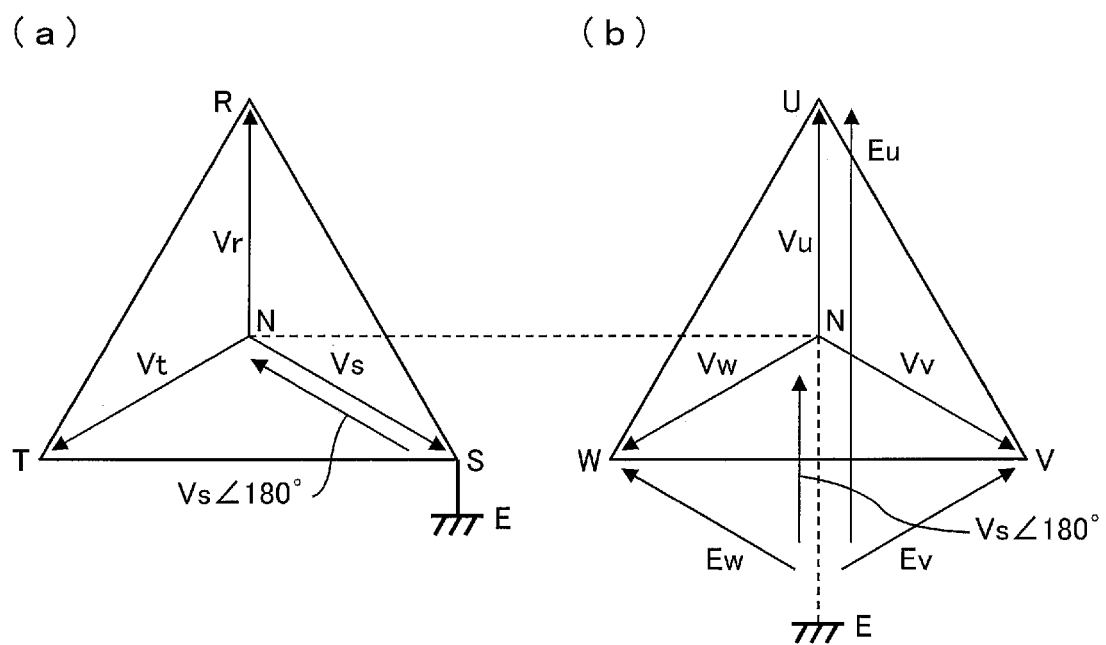
FIG. 3 is a diagram illustrating a principle for calculating a voltage-to-ground of a commercial power system according to the first embodiment of the invention.

FIG. 3 is a diagram illustrating a principle for calculating a voltage-to-ground of the commercial power system 2 according to the first embodiment of the invention. The leakage current calculation device 1 according to this embodiment calculates a voltage (a voltage-to-ground) applied to the insulation resistance-to-ground of the three-phase motor 5 to calculate the insulation resistance-to-ground of the three-phase motor 5. The method of calculating the voltage-to-ground will be described below with reference to FIG. 3.

The voltage-to-ground applied to the insulation resistance-to-ground of the three-phase motor 5 is equal to a voltage between the neutral point (an N phase) of the commercial power system 2 and the ground E. In the commercial power system 2, as illustrated in (a) of FIG. 3, the S phase (the S line) is grounded. Since the voltage of the S phase with respect to the neutral point is a system voltage Vs between the N phase and the S phase, the voltage between the N phase and the ground E is a voltage Vs∠180° with a phase different 180° from the phase of the system voltage Vs. The voltage between the neutral point (the N phase) and the T phase is voltage Vt.

On the other hand, as illustrated in (b) of FIG. 3, the potential of the neutral point N of the inverter 3 is equal to the potential of the neutral point N of the commercial power system 2. Accordingly, the voltage between the neutral point N of the inverter 3 and the ground E is equal to the voltage-to-ground Vs∠180° of the commercial power system 2. As illustrated in (b) of FIG. 3, the U-phase voltage-to-ground Eu has a value obtained by adding Vs∠180° to the voltage Vu between the N phase and the U phase. The V-phase voltage-to-ground Ev has a value obtained by adding Vs∠180° to the voltage Vv between the N phase and the V phase. The W-phase voltage-to-ground Ew has a value obtained by adding Vs∠180° to the voltage Vw between the N phase and the W phase. That is, Eu=Vu+Vs∠180°, Ev=Vv+Vs∠180°, and Ew=Vw+Vs∠180° are established.

Here, since the U-phase voltage Vu, the V-phase voltage Vv, and the W-phase voltage Vw are 120° out-of-phase from each other, the phase voltages have a characteristic that the sum of the phase voltages is zero. That is, Vu+Vv+Vw=0 is established. Accordingly, the voltage Vs∠180° is a voltage-to-ground corresponding to the system frequency of the commercial power system 2 which is applied to the insulation resistance-to-ground of the three-phase motor 5.

As illustrated in (a) of FIG. 3, the R-S line voltage is a vector sum of the voltage Vr between the neutral point (the N phase) and the R phase and the voltage-to-ground Vs. The voltage-to-ground calculating part 13 can calculate the system voltage Vs of the commercial power system 2 by dividing the measured R-S line voltage by √3. The system voltage Vs and the voltage-to-ground Vs∠180° have the same effective value and have phases which are 180° out-of-phase from each other. Accordingly, the voltage-to-ground calculating part 13 can calculate the voltage-to-ground Vs∠180° by shifting the phase of the calculated system voltage Vs by 180°.

(Leakage Current)

Figure 4A:
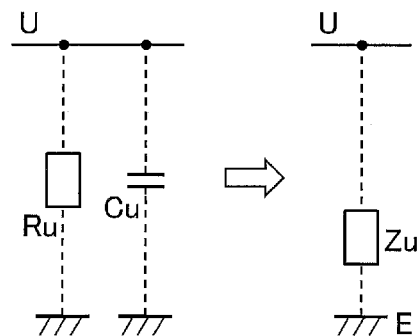
FIGS. 4A and 4B are diagrams illustrating a leakage current flowing between a three-phase motor and the ground in the first embodiment of the invention.
Figure 4B:
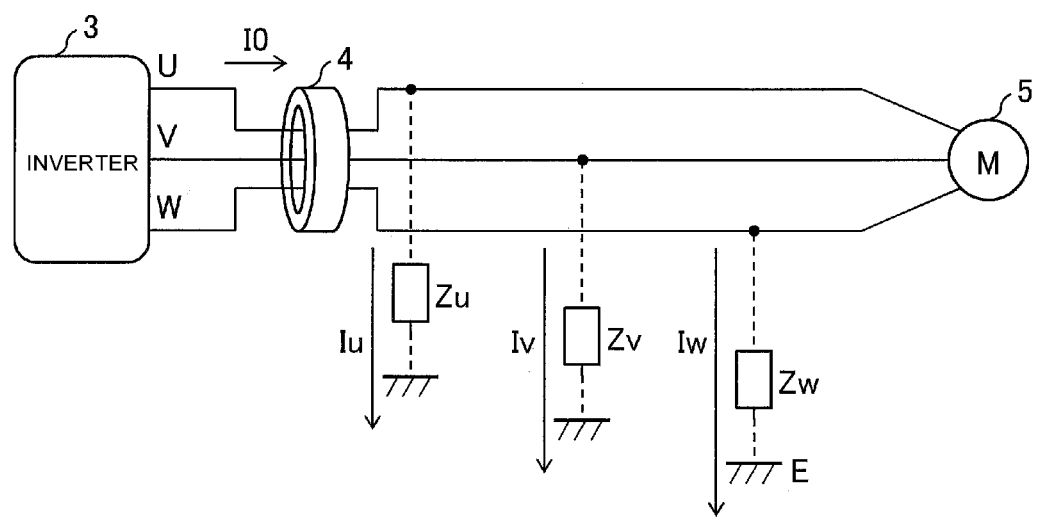

FIGS. 4A and 4B are diagrams illustrating a leakage current flowing between the three-phase motor 5 and the ground E in the first embodiment of the invention.

An insulation resistance-to-ground and a stray capacitance-to-ground of the three-phase motor 5 are impedance components between a wire or a coil of the three-phase motor 5 and the ground E. They are connected in parallel to each other. Accordingly, as illustrated in FIG. 4A, the insulation resistance-to-ground Ru and the stray capacitance-to-ground Cu between the U phase on the output side of the inverter 3 and the ground E are both components constituting an impedance Zu between the U phase and the ground E.

Similarly, the insulation resistance-to-ground Rv and the stray capacitance-to-ground Cv between the V phase and the ground E are both components constituting an impedance Zv between the V phase and the ground E. The insulation resistance-to-ground Rw and the stray capacitance-to-ground Cw between the W phase and the ground E are both components constituting an impedance Zw between the W phase and the ground E.

As illustrated in FIG. 4B, on the output side of the inverter 3, leakage currents respectively flow in the phases. Specifically, a leakage current Iu flows in the U phase, a leakage current Iv flows in the V phase, and a leakage current Iw flows in the W phase. The zero-phase current I0 flowing on the output side of the inverter 3 is equal to the total sum of the leakage currents flowing of the phases. Accordingly, I0=Iu+Iv+Iw is established.

When paying attention to a system frequency component, the voltage-to-ground Vs∠180° is applied in-phase to the phases (U, V, and W) on the output side of the inverter 3. Accordingly, Iu=Vs∠180°, Iv=Vs∠180°÷Zv, and Iw=Vs∠180°÷Zw are established. As a result, I0=Vs∠180°÷(1÷Zu+1÷Zv+1÷Zw) is established.

As described above, the zero-phase current I0 which is measured using the zero-phase current transformer 4 is equal to a leakage current flowing through a combined impedance of the three-phase motor 5. Accordingly, in the following description, the leakage current may be referred to as a leakage current I0.

(Insulation Resistance-to-Ground)

Figure 5A:
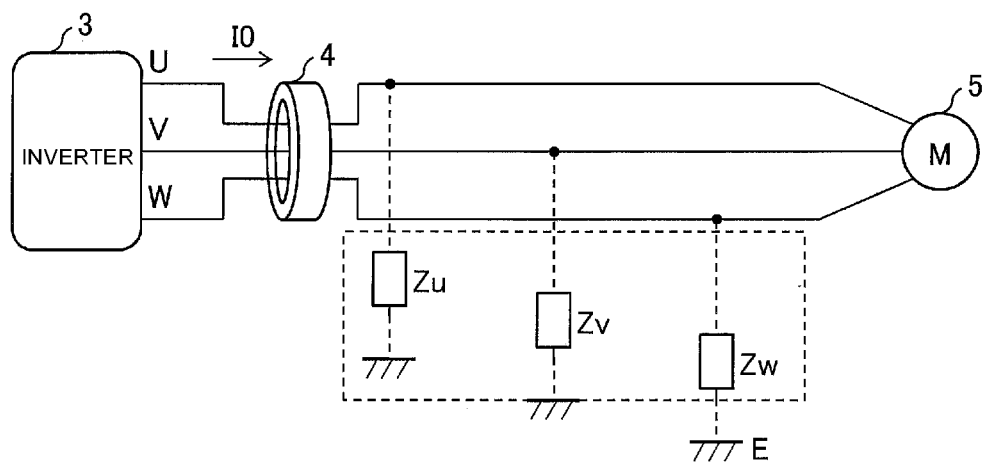
FIGS. 5A and 5B are diagrams illustrating an insulation resistance-to-ground between the three-phase motor and the ground in the first embodiment of the invention.
Figure 5B:
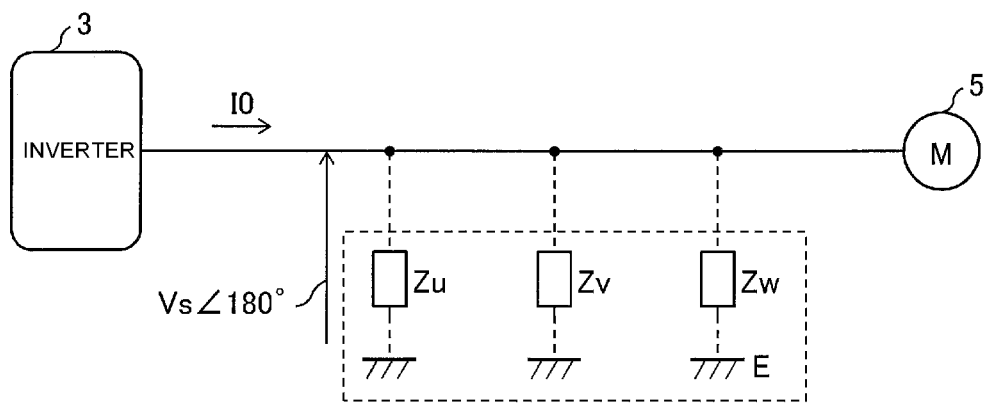

FIGS. 5A and 5B are diagrams illustrating the insulation resistance-to-ground between the three-phase motor 5 and the ground E in the first embodiment of the invention.

When paying attention to the system frequency component, the voltage-to-ground $Vs\angle 180°$ is applied in-phase to the phases (U, V, and W) on the output side of the inverter 3. This can be said to mean that Zu, Zv, and Zw are connected in parallel to a common bus to which the voltage-to-ground $Vs\angle 180°$ is applied. Accordingly, when a combined impedance between the three-phase motor 5 and the ground E is defined as ZO, $1 \div ZO = 1 \div Zu + 1 \div Zv + 1 \div Zw$ is established. This equation is modified to $I0 = Vs\angle 180° \div ZO$ and thus $ZO = Vs\angle 180° \div I0$ is established.

The combined impedance-to-ground ZO includes the insulation resistance-to-ground and the stray capacitance-to-ground of the three-phase motor 5 which are connected in parallel respectively as components. Accordingly, a current IOr flowing through the insulation resistance-to-ground of ZO is $I0 \times \cos\theta$, where a phase difference between the zero-phase current I0 and the voltage-to-ground $Vs\angle 180°$ is defined as $\theta$. On the other hand, a current IOc flowing through the stray capacitance-to-ground of ZO is $I0 \times \sin\theta$.

Accordingly, the insulation resistance-to-ground RO of the three-phase motor 5 is calculated by $RO = Vs\angle 180° \div IOr$. On the other hand, the stray capacitance-to-ground CO of the three-phase motor 5 is calculated by $CO = Vs\angle 180° \div IOc$.

(Principle for Calculating Leakage Current)

Figure 6A:
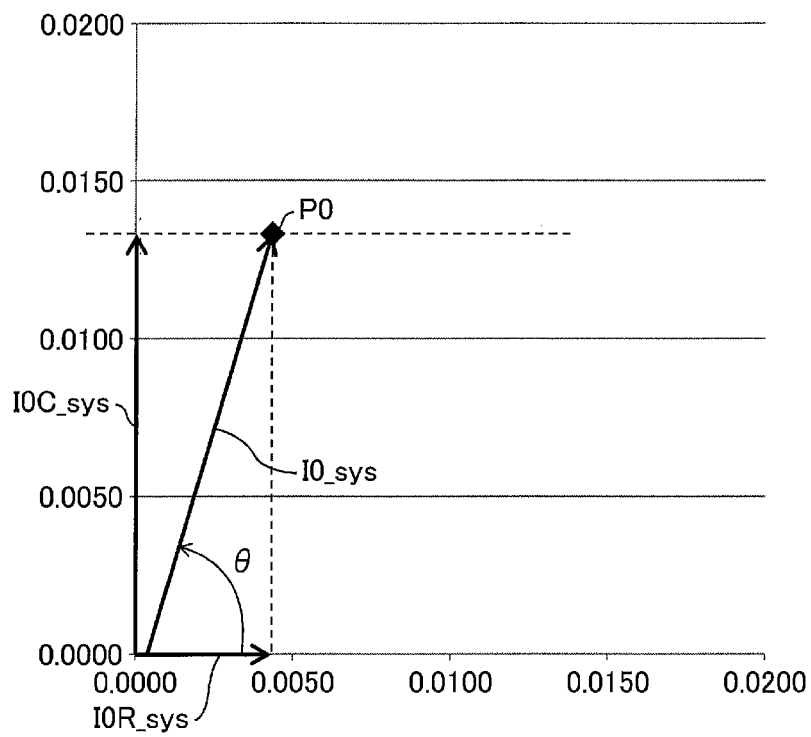
FIGS. 6A and 6B are diagrams illustrating a principle for the leakage current calculation device according to the first embodiment of the invention to calculate a leakage current synchronized with the system frequency of the commercial power system.
Figure 6B:
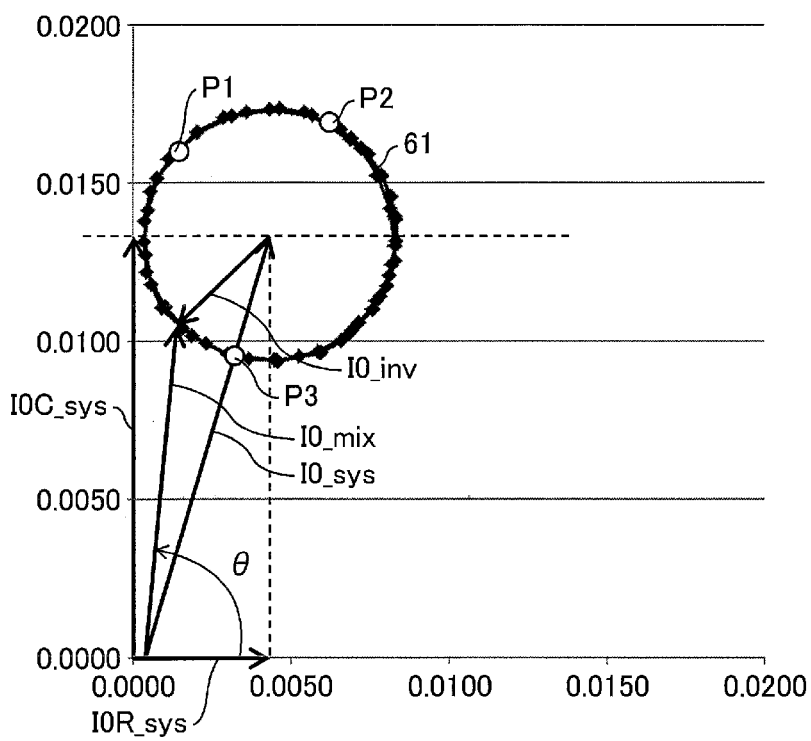

FIGS. 6A and 6B are diagrams illustrating a principle for which the leakage current calculation device 1 according to the first embodiment of the invention to calculate a leakage current synchronized with the system frequency of the commercial power system 2.

The leakage current I0 which is measured by the leakage current measuring part 12 includes a component (I0_sys) synchronized with the system frequency of the commercial power system 2 and a component (I0_inv) synchronized with the operating frequency of the inverter 3. In order to calculate the insulation resistance-to-ground of the three-phase motor 5, it is necessary to extract only the leakage current I0_sys which is a leakage current component synchronized with the system frequency from the leakage current I0.

In FIG. 6A, the frequency (the system frequency) of a voltage supplied from the commercial power system 2 to the inverter 3 is 60 Hz, and the frequency (the operating frequency) of a voltage which is used for the inverter 3 to drive the three-phase motor 5 is 50 Hz. That is, both frequencies are set to be different from each other.

In this case, the system frequency component extracting part 14 extracts only the leakage current I0_sys of the system frequency component from the measured leakage current I0 by performing a computing process of extracting the leakage current of the same frequency as the system frequency. Since the system frequency is different from the operating frequency, the component synchronized with the system frequency is extracted by this extraction process, but the component synchronized with the operating frequency is not extracted. Accordingly, the extracted leakage current I0_sys does not include the leakage current I0_inv synchronized with the operating frequency component of the inverter 3.

The impedance between the three-phase motor 5 and the ground E includes both the insulation resistance-to-ground and the stray capacitance-to-ground. Since the voltage-to-ground $Vs\angle 180°$ is applied to both the insulation resistance-to-ground and the stray capacitance-to-ground, the phase of the measured leakage current I0 is different from the phase of the voltage-to-ground $Vs\angle 180°$ due to an influence of the stray capacitance-to-ground. Accordingly, the phase difference $\theta$ of the leakage current I0_sys extracted from the leakage current I0 is different from the phase of the voltage-to-ground $Vs\angle 180°$.

As illustrated in FIG. 6A, when the system frequency is different from the operating frequency, the leakage current component extracted from the leakage current I0 includes only the leakage current I0_sys. Accordingly, the phase difference $\theta$ between the voltage-to-ground $Vs\angle 180°$ and the leakage current component (I0_sys) is always constant regardless of the measuring time points.

Accordingly, as illustrated in FIG. 6A, when a vector of the leakage current I0_sys is drawn with an origin in a planar coordinate system as a start point and with an angle of the phase difference $\theta$ provided on the horizontal axis of the planar coordinate system, it can be noticed that an end point P0 of the vector is always concentrated on the same point regardless of the time points at which the leakage current I0_sys is extracted. Accordingly, a vector connecting the origin of the planar coordinate system to a point obtained by projecting the end point P0 onto the horizontal axis of the planar coordinate system accurately corresponds to a resistance leakage current I0R_sys of the system frequency component. That is, the value of the projected point is an effective value of I0R_sys. On the other hand, a vector connecting the origin of the planar coordinate system to a point obtained by projecting the end point P0 onto the vertical axis of the planar coordinate system accurately corresponds to a capacitance leakage current I0C_sys of the system frequency component. That is, the value of the projected point is an effective value of I0C_sys.

As described above, when the system frequency of the commercial power system 2 is different from the operating frequency of the inverter 3, the leakage current calculation device 1 can accurately calculate the leakage current I0_sys corresponding to the system frequency by extracting a component synchronized with the system frequency from the measured leakage current I0. As a result, it is possible to accurately calculate the insulation resistance-to-ground of the three-phase motor 5 using the voltage-to-ground $Vs\angle 180°$ and the leakage current I0R_sys.

When Frequencies are the Same

On the other hand, when the system frequency of the commercial power system 2 is the same as the operating frequency of the inverter 3, an end point when the leakage current I0 is expressed as a vector is not fixed to be one point, and the position thereof changes depending on the measuring time points. This is because the leakage current extracted by the system frequency component extracting part 14 includes both the leakage current I0_sys corresponding to the system frequency and the leakage current I0_inv corresponding to the operating frequency.

When the system frequency and the operating frequency are set to the same frequency, the system frequency component extracting part 14 cannot distinguish a component synchronized with the system frequency and a component synchronized with the operating frequency which are included in the leakage current I0. Accordingly, when the system frequency component extracting part 14 performs the process of extracting the component synchronized with the system frequency from the leakage current I0, a leakage current I0_mix in which the leakage current I0_sys synchronized with the system frequency and the leakage current I0_inv synchronized with the operating frequency are mixed is extracted as a result.

In this case, as illustrated in FIG. 6B, the vector which is drawn in the planar coordinate system is a combined vector (the vector I0_mix) of the vector of I0_sys and the vector of I0_inv. Although details will be described later, the position of an end point of the combined vector changes depending on the measuring time points, such as a point P1 (a specific point), a point P2 (a specific point), and a point P3 (a specific point), due to an influence of I0_inv. Specifically, as illustrated in FIG. 6B, this change is occurs such that the end points describe a circle 61.

Accordingly, when the system frequency and the operating frequency are the same, the end point of the vector is not fixed to one point unlike FIG. 6A and thus the resistance leakage current I0R_sys corresponding to the system frequency cannot be accurately calculated on the basis of the end point. In other words, even when I0R_sys is calculated on the basis of the end point, the value thereof changes depending on the measuring time points and thus an accurate value cannot be specified.

(Reason for Describing Circle)

Figure 7A:
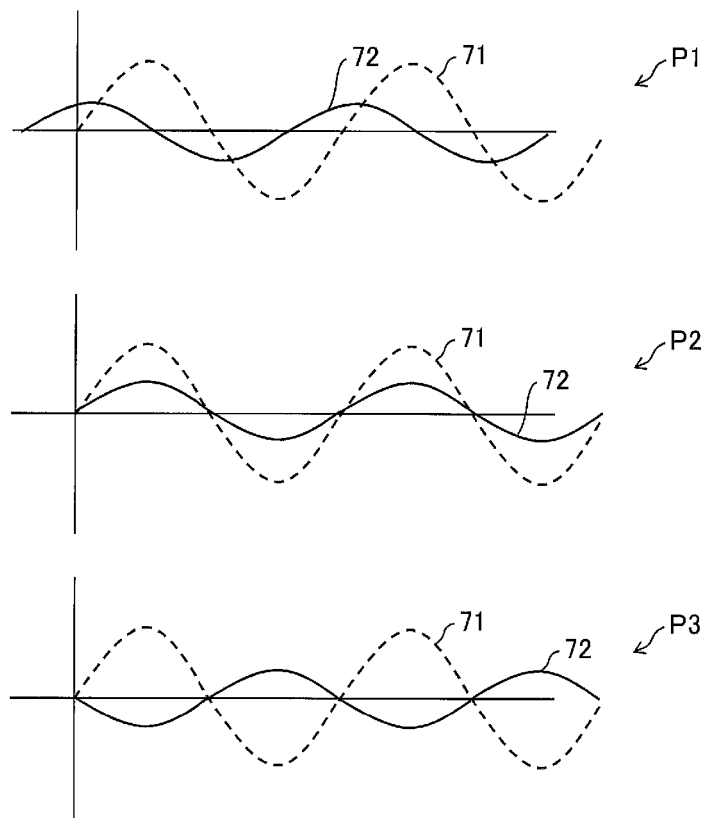
FIGS. 7A and 7B are diagrams illustrating a principle in which an end point rotates when an extracted leakage current is expressed as a vector in a case in which a system frequency and an operating frequency are the same in the first embodiment of the invention.
Figure 7B:
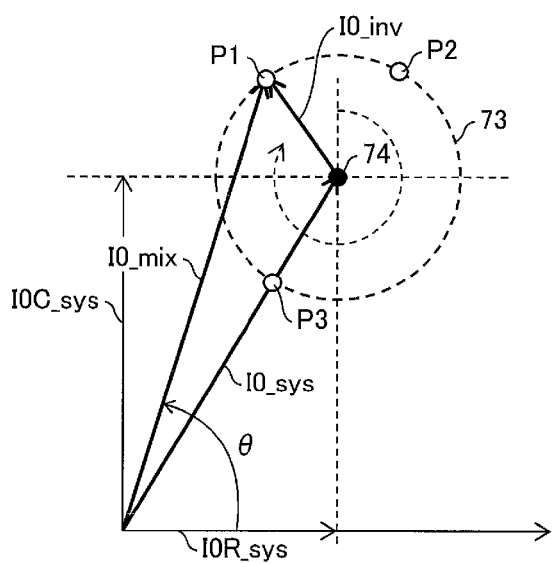

FIGS. 7A and 7B are diagrams illustrating a principle in which an end point rotates when an extracted leakage current component is expressed as a vector in a case in which the system frequency and the operating frequency are the same in the first embodiment of the invention.

Even when the system frequency and the operating frequency are set to the same value, both frequencies will be strictly slightly different from each other. For example, when both frequencies are respectively set to 60 Hz, a slight difference is present therebetween like a case in which the system frequency is 60.00 Hz while the operating frequency is 60.01 Hz. Due to the frequency difference, as illustrated in FIG. 7A, a waveform 71 of I0_sys and a waveform 72 of I0_inv become gradually different from each other as the measuring time point transitions slowly to P1, P2, and P3.

As described above, when the system frequency and the operating frequency are the same, the leakage current I0_mix extracted from the leakage current I0 includes the leakage current I0_sys corresponding to the system frequency and the leakage current I0_inv corresponding to the operating frequency. In this case, the determined phase difference θ is a phase difference between the voltage-to-ground Vs∠180° and the leakage current I0_mix and thus the value of the phase difference θ changes with the elapse of time due to a difference between the waveform of I0_sys and the waveform of I0_inv included in the leakage current I0_inv. Accordingly, the position of the end point when the leakage current I0_mix is expressed as a vector changes with the elapse of time. For example, the positions of the end points (specific points) P1 to P3 of the leakage current I0_change to correspond to differences between the waveforms of P1 to P3 in FIG. 7A. The phase difference θ changes with the elapse of time due to the change and thus the end point of I0_mix describes a circle 73 with the elapse of time as illustrated in FIG. 7B. That is, P1 to P3 are plotted onto the circle 73 in principle.

The end point of I0_sys matches the center 74 of the circle 73. Accordingly, the leakage current calculation device 1 according to this embodiment accurately calculates IOR_sys and IOC_inv by calculating the center 74 and projecting the center 74 onto the horizontal axis and the vertical axis respectively of the planar coordinate system.

There are various methods of calculating the center of the circle which is described by the end point of the leakage current I0_mix. Hereinafter, three of the methods will be described respectively.

First Method

Figure 8:
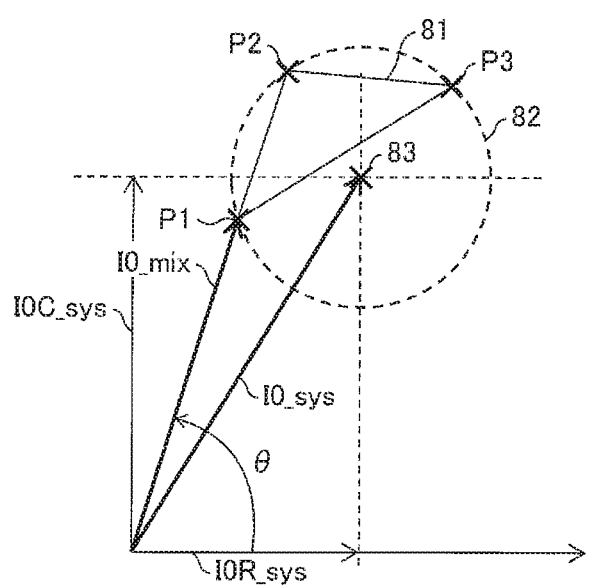
FIG. 8 is a diagram illustrating a first method for calculating an insulation resistance-to-ground leakage current in the first embodiment of the invention.

FIG. 8 is a diagram illustrating a first method for calculating an insulation resistance-to-ground leakage current in the first embodiment of the invention.

In the example illustrated in FIG. 8, the system frequency component extracting part 14 extracts I0_mix at three different time points. Similarly, the phase difference calculating part 15 calculates the phase difference θ at the three different time points. Accordingly, the circle center calculating part 16 calculates the points P1 to P3 which are end points when each I0_mix is expressed as a vector on the basis of the leakage currents I0_mix and the phase differences θ which are determined at the three different time points.

The circle center calculating part 16 calculates a circumcenter of a triangle 81 with the points P1 to P3 as vertices instead of directly calculating a circle 82 passing through the points P1 to P3. The circumcenter is the same as the center 83 of the circle 82 which circumscribes the triangle 81. In this way, in the example illustrated in FIG. 8, the circle center calculating part 16 can calculate the center 83 of the circle 82 passing through the points by calculating the circumcenter of the triangle 81 with the points P1 to P3 as vertices.

The circle center calculating part 16 outputs the calculated center 83 to the resistance leakage current calculating part 17. As illustrated in FIG. 8, a vector with the origin of the planar coordinate system as a start point and with the center 83 as an end point is the same as the leakage current I0_sys corresponding to the system frequency in the leakage current I0_mix extracted from the leakage current I0. Therefore, the resistance leakage current calculating part 17 can calculate the insulation resistance-to-ground leakage current IOR_sys in the leakage current I0_sys corresponding to the system frequency by projecting the calculated center 83 onto the horizontal axis.

The resistance leakage current calculating part 17 outputs the calculated leakage current IOR_sys to the insulation resistance calculating part 18. The insulation resistance calculating part 18 calculates the insulation resistance-to-ground of the three-phase motor 5 using the leakage current IOR_sys and the voltage-to-ground Vs∠180°.

In this method, the center 83 is calculated using only three points P1 to P3. That is, since it suffices to measure the leakage current I0 has only to be measured at three different time points to calculate the leakage current IOR_sys, it is possible to fast calculate the IOR_sys.

(Second Method)

Figure 9A:
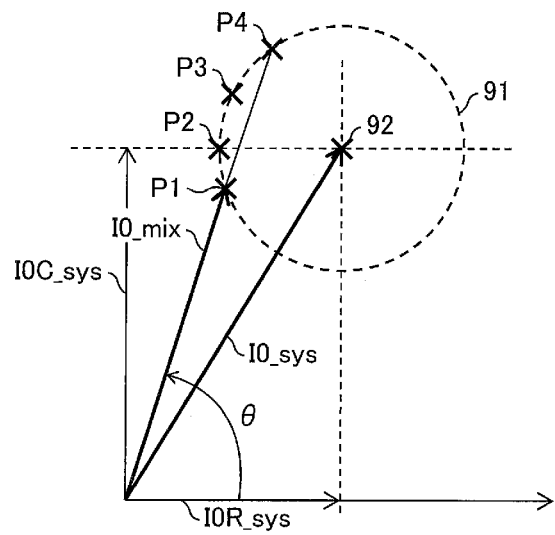
FIGS. 9A and 9B are diagrams illustrating a second method for calculating the insulation resistance-to-ground leakage current in the first embodiment of the invention.
Figure 9B:
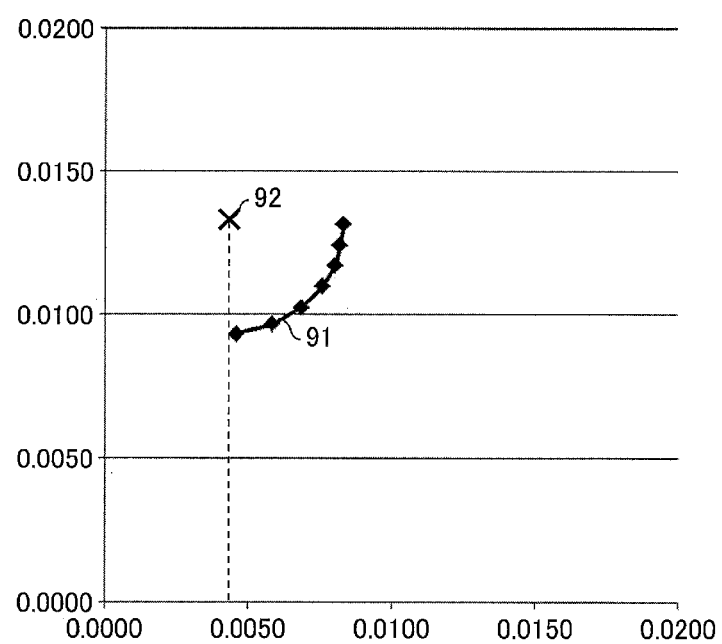

FIGS. 9A and 9B are diagrams illustrating a second method for calculating the insulation resistance-to-ground leakage current in the first embodiment of the invention.

In the example illustrated in FIGS. 9A and 9B, the system frequency component extracting part 14 extracts I0_mix at four or more different time points. Similarly, the phase difference calculating part 15 calculates the phase difference θ at the four or more different time points. Accordingly, the circle center calculating part 16 calculates the points Pn (where n=1, 2, 3, 4, . . . ) which are end points when the leakage currents I0_mix are expressed as vectors on the basis of the leakage currents I0_mix and the phase differences θ which are determined at the four or more time points.

The circle center calculating part 16 calculates an equation of a circle 91 passing through the points Pn. The center 92 of the circle 91 is calculated using the equation. In the example illustrated in FIGS. 9A and 9B, the circle center calculating part 16 calculates the equation of the circle 91 using a least squares method of a circle using the calculated points Pn. Hereinafter, this method will be more specifically described.

Figure 10:
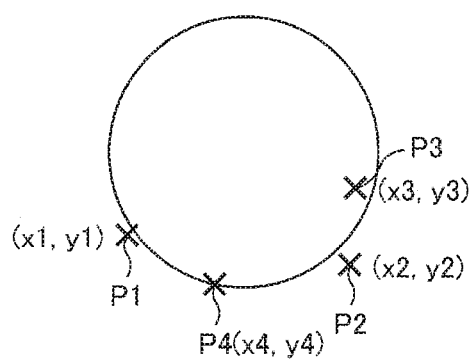
FIG. 10 is a diagram illustrating a least squares method of a circle in the first embodiment of the invention.

FIG. 10 is a diagram illustrating a least square method of a circle in the first embodiment of the invention. As illustrated in the drawing, it is assumed that the points Pn are calculated as a point P1(x1, y1), a point P2 (x2, y2), a point P3 (x3, y3), a point P4 (x4, y4), . . . . In this embodiment, the equation of the circle 91 approximating the points is assumed to be $(x-a)^2 \times (y-b)^2 = r^2$, and coefficients a, b, and r with which a square-sum E of errors between the points and the equation $(x-a)^2 \times (y-b)^2 = r^2$ is minimized are calculated using the least squares method.

The error E is defined by $E = \Sigma((x-a)^2 \times (y-b)^2 - r^2)$. However, when the error E is calculated using this expression, a, b, and r are all quartic functions and thus calculation thereof is very complicated. Therefore, a relational expression in which a, b, and r are replaced with parameters A, B, and C is first obtained as follows.

$$E = \Sigma(x^2 + y^2 + Ax + By + C)$$

Here, $A = -2a$, $B = -2b$, and $C = a^2 + b^2 - r^2$ are established. The following expressions are obtained by partially differentiating the relational expression.

$$\begin{cases} \partial/\partial A = A\sum x^2 + B\sum xy + C\sum x + \sum x^3 + \sum xy^2 = 0 \\ \partial/\partial B = A\sum xy + B\sum y^2 + C\sum y + \sum x^2 y + \sum y^3 = 0 \\ \partial/\partial C = A\sum x + B\sum y + C\sum 1 + \sum x^2 + \sum y^2 = 0 \end{cases} \quad [\text{Math. 1}]$$

The following matrix expression is obtained by solving these expressions using matrix calculation.

$$\begin{pmatrix} \sum x^2 & \sum xy & \sum x \\ \sum xy & \sum y^2 & \sum y \\ \sum x & \sum y & \sum 1 \end{pmatrix} \begin{pmatrix} A \\ B \\ C \end{pmatrix} = \begin{pmatrix} -\sum(x^3+xy^2) \\ -\sum(x^2 y+y^3) \\ -\sum(x^2+y^2) \end{pmatrix} \quad [\text{Math. 2}]$$

The following matrix expression is obtained by developing the matrix expression.

$$\begin{pmatrix} A \\ B \\ C \end{pmatrix} = \begin{pmatrix} \sum x^2 & \sum xy & \sum x \\ \sum xy & \sum y^2 & \sum y \\ \sum x & \sum y & \sum 1 \end{pmatrix}^{-1} \begin{pmatrix} -\sum(x^3+xy^2) \\ -\sum(x^2 y+y^3) \\ -\sum(x^2+y^2) \end{pmatrix} \quad [\text{Math. 3}]$$

The parameters A, B, and C are determined by solving the matrix expression. By substituting the determined parameters A, B, and C into the above-mentioned relational expression, the coefficients a, b, and r can be determined. Accordingly, since the equation of the circle 91 is calculated, the center 92 is calculated using the equation. The calculation of the insulation resistance-to-ground leakage current I0_sys based on the center 92 and the calculation of the insulation resistance-to-ground of the three-phase motor 5 based on the leakage current I0_sys and the voltage-to-ground Vs∠180° are the same as in the above-mentioned example.

In this method, since the least squares method of a circle is used for calculation of the circle 91, it is possible to more accurately calculate the center 92 of the circle 91. Accordingly, it is possible to more accurately calculate the leakage current I0_sys and the insulation resistance-to-ground.

An example of an actual calculation result of I0_sys is illustrated in FIG. 9B. In this example, $(x-0.0044)^2 + (y-0.0133)^2 = 0.0039^2$ is calculated as the equation of the circle 91. When the center 92 determined from the equation is projected onto the horizontal axis, the value is 4.4 mA and thus 4.4 mA is calculated as I0R_sys. Since a theoretical value of I0_sys in the three-phase motor 5 used for this calculation is 4.3 mA, it can be seen that the calculation result matches the theoretical value. The insulation resistance-to-ground of the three-phase motor 5 calculated using I0_sys of 4.4 mA is 26.9 kΩ which also well matches the theoretical value 27 kΩ.

(Third Method)

Figure 11A:
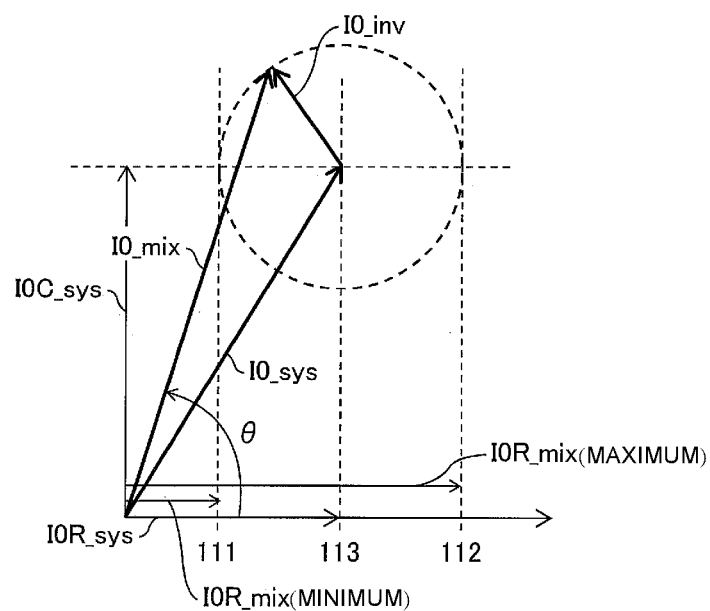
FIGS. 11A and 11B are diagrams illustrating a third method for calculating the insulation resistance-to-ground leakage current in the first embodiment of the invention.
Figure 11B:
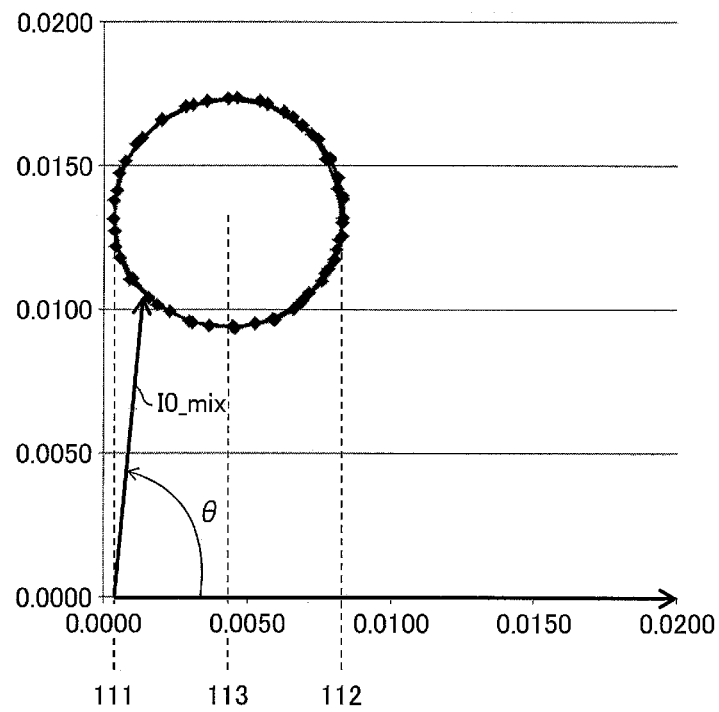

FIGS. 11A and 11B are diagrams illustrating a third method for calculating the insulation resistance-to-ground leakage current in the first embodiment of the invention.

In the example illustrated in FIGS. 11A and 11B, instead of directly calculating the center of the circle, the system frequency component extracting part 14 calculates a minimum value of the insulation resistance-to-ground leakage current in I0_mix and a maximum value of the insulation resistance-to-ground leakage current in I0_mix within a fixed time and calculates a median value therebetween as I0R_sys.

In this method, the system frequency component extracting part 14 extracts I0_mix at each time point over a fixed time (preferably, a long time equal to or longer than 60 seconds), that is, until points corresponding to one round (turn) or more of a circle are calculated. Similarly, the phase difference calculating part 15 calculates the phase difference θ at the each time point until points corresponding to one round (turn) or more of a circle are calculated. In this method, the circle center calculating part 16 does not calculate a center of a circle. Instead, the insulation resistance calculating part 18 calculates the insulation resistance-to-ground leakage current IOR_mix in the leakage current I0_mix at the each time point using the leakage current I0_mix and the phase difference θ which are acquired at the each time point. This is calculated by multiplying I0_mix by cosθ. That is, IOR_mix = mix × cosθ is established.

The insulation resistance calculating part 18 performs the calculation of IOR_mix at each time point over a long time (60 seconds or more). The value of IOR_mix is equal to a value on the horizontal axis at a point obtained by projecting an end point when I0_mix is expressed as a vector onto the horizontal axis. Since the end point describes a circle as described above, the point obtained by projecting the end point onto the horizontal axis is always present on a line acquired by projecting a whole circle onto the horizontal axis. Accordingly, for the calculated IOR_mix, a minimum value 111 and a maximum value 112 respectively corresponding to ends of the line are naturally determined.

Since the minimum value 111 and the maximum value 112 respectively correspond to the ends in the horizontal direction on the circle which is described by the end point of I0_mix, a median value 113 between the minimum value 111 and the maximum value 112 corresponds to the center of the circle. As described above, since the value obtained by projecting the center of the circle onto the horizontal axis corresponds to I0R_sys, the resistance leakage current calculating part 17 can calculate I0R_sys by calculating the median value 113.

Calculation of the insulation resistance-to-ground of the three-phase motor 5 based on I0R_sys and the voltage-to-ground Vs∠180° is the same as described above.

In this method, it is not necessary to calculate the center of the circle using a complicated equation to calculate the leakage current I0R_sys, and the leakage current I0R_sys is acquired by simple calculation.

An example of an actual calculation result of the leakage current I0R_sys using the third method is illustrated in FIG. 11B. In this example, 4.3 mA is calculated as the median value 113, that is, as I0R_sys. The insulation resistance-to-ground of the three-phase motor 5 calculated using I0R_sys of 4.3 mA is 27.1 kΩ which well matches 27 kΩ as a theoretical value.

Second embodiment

A second embodiment of the invention will be described below with reference to FIGS. 12 and 13. The same elements as in the first embodiment will be referenced by the same reference signs and detailed description thereof will not be repeated.

Schematic Configuration

Figure 12:
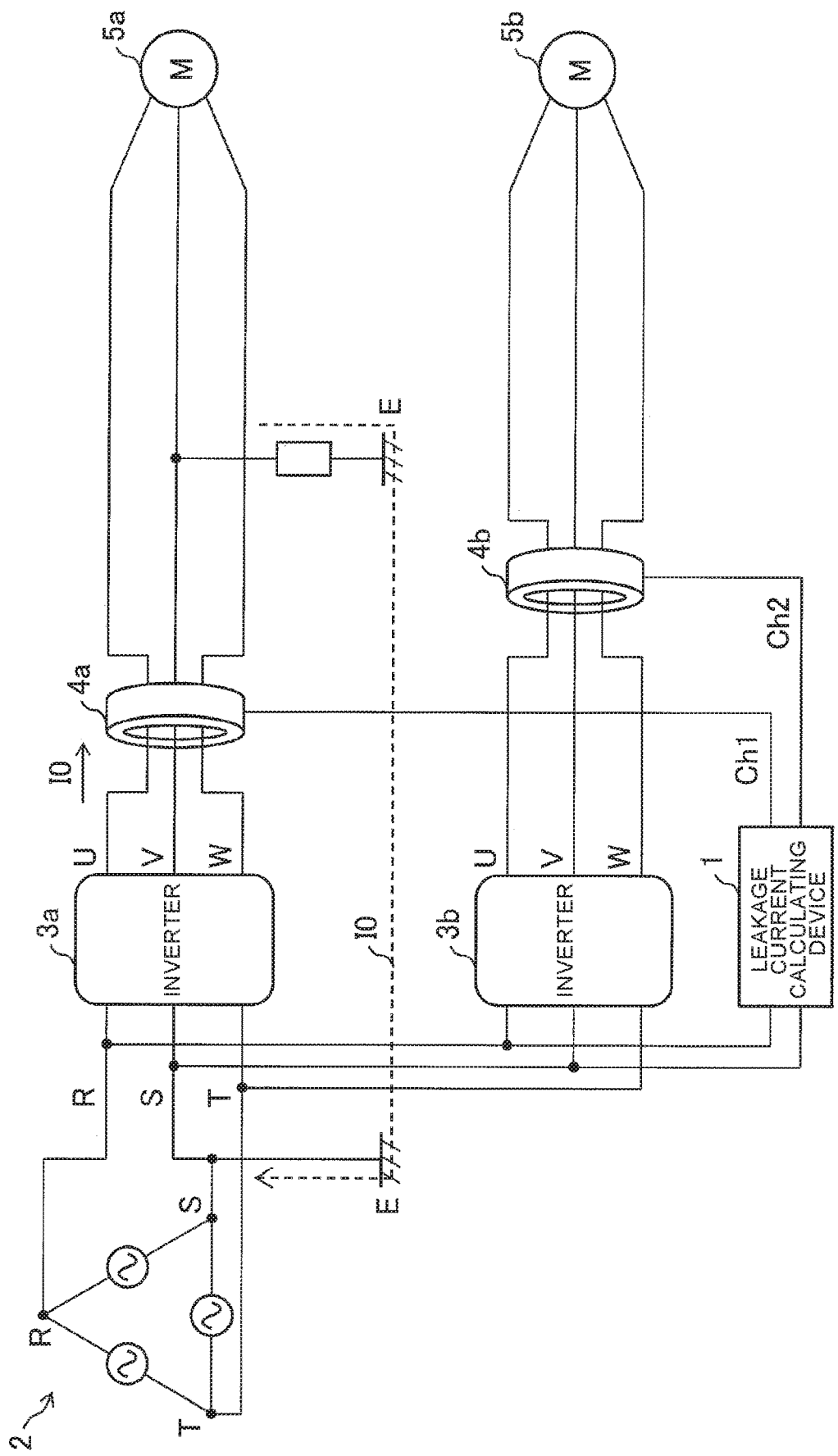
FIG. 12 is a system diagram schematically illustrating a configuration example in which a leakage current calculation device according to a second embodiment of the invention is employed.

FIG. 12 is a system diagram schematically illustrating a configuration example of a configuration in which a leakage current calculation device 1 according to a second embodiment of the invention is employed. In this embodiment, the configuration of the leakage current calculation device 1 is basically the same as in the first embodiment. However, in this embodiment, a single leakage current calculation device 1 can monitor each of a plurality of three-phase motors 5a and 5b as illustrated in FIG. 12.

The three-phase motors 5a and 5b are driven by inverters 3a and 3b, respectively, Respective input sides of the inverters 3a and 3b are both connected to a common commercial power system 2. An output side of the inverter 3a is connected to the three-phase motor 5a, while and an output side of the inverter 3b is connected to the three-phase motor 5b.

A zero-phase current transformer 4a is disposed between the inverter 3a and the three-phase motor 5a, while a zero-phase current transformer 4b is disposed between the inverter 3b and the three-phase motor 5b. The zero-phase current transformers 4a and 4b are both connected to the leakage current measuring part 12 of the leakage current calculation device 1.

Calculation Procedure

In this embodiment, the leakage current calculation device 1 calculates an insulation resistance-to-ground leakage current and an insulation resistance-to-ground corresponding to each of the three-phase motors 5a and 5b. The calculation procedure thereof will be described below.

The voltage measuring part 11 measures at least one of line voltages on the input side of any of the plurality of inverters 3a and 3b. Since the input sides of the inverters 3a and 3b are connected to the common commercial power system 2, for example, a voltage Rs between the R phase and the S phase of the inverter 3a is completely equal to a voltage Rs between the R phase and the S phase of the inverter 3b. In this way, in this embodiment, since the voltage Rs may be measured at only one position, it is possible to simplify the configuration of the leakage current calculation device 1.

The voltage-to-ground calculating part 13 calculates the voltage-to-ground Vs∠180° on the basis of the voltage Rs measured on the input side of the inverter 3a. Since the voltage Rs is common to the inverters 3a and 3b, the leakage current calculation device 1 uses the voltage-to-ground Vs∠180° as a voltage-to-ground common to the three-phase motor 5a and the three-phase motor 5b in the following process.

The leakage current measuring part 12 measures a leakage current of the three-phase motor 5a using the zero-phase current transformer 4a and measure a leakage current of the three-phase motor 5b using the zero-phase current transformer 4b. That is, the leakage current calculation device 1 includes a single leakage current measuring part 12 which is common to the three-phase motors 5a and 5b.

The leakage current calculation device 1 may include a plurality of leakage current measuring parts 12a and 12b respectively corresponding to the three-phase motors 5a and 5b. In this configuration, the leakage current measuring part 12a is connected to the zero-phase current transformer 4a, while the leakage current measuring part 12b is connected to the zero-phase current transformer 4b. The leakage current measuring part 12a measures the leakage current of the three-phase motor 5a using the zero-phase current transformer 4a, while the leakage current measuring part 12b measures the leakage current of the three-phase motor 5b using the zero-phase current transformer 4b.

The system frequency component extracting part 14 extracts a leakage current component corresponding to the three-phase motor 5a from the leakage current of the three-phase motor 5a. On the other hand, the system frequency component extracting part 14 extracts a leakage current component corresponding to the three-phase motor 5b from the leakage current of the three-phase motor 5b.

The phase difference calculating part 15 calculates a phase difference between the calculated voltage-to-ground and the leakage current component of the three-phase motor 5a. The phase difference calculating part 15 further calculates a phase difference between the calculated voltage-to-ground and the leakage current component of the three-phase motor 5b.

The resistance leakage current calculating part 17 calculates an insulation resistance-to-ground leakage current of the three-phase motor 5a on the basis of a center of a circle corresponding to the three-phase motor 5a. The resistance leakage current calculating part 17 calculates an insulation resistance-to-ground leakage current of the three-phase motor 5b on the basis of a center of a circle corresponding to the three-phase motor 5b.

The insulation resistance calculating part 18 calculates an insulation resistance-to-ground of the three-phase motor 5a from the voltage-to-ground Vs∠180° and the insulation resistance-to-ground leakage current of the three-phase motor 5a. The insulation resistance calculating part 18 calculates an insulation resistance-to-ground of the three-phase motor 5b from the voltage-to-ground Vs∠180° and the insulation resistance-to-ground leakage current of the three-phase motor 5b.

Figure 13A:
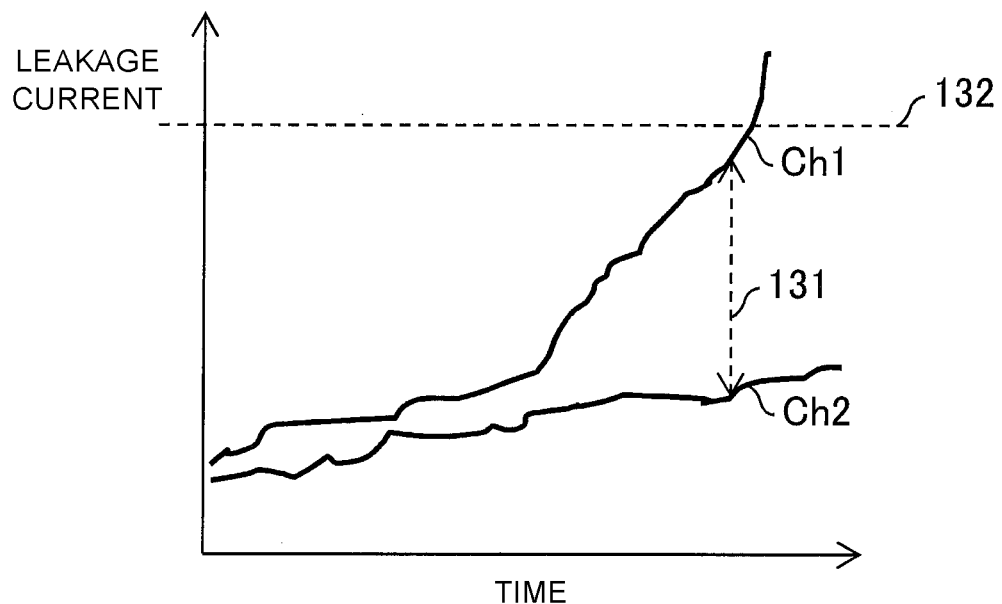
FIGS. 13A and 13B are diagrams illustrating an example of change of a calculated value of an insulation resistance-to-ground leakage current or an insulation resistance-to-ground over time for each three-phase motor in the second embodiment of the invention.
Figure 13:
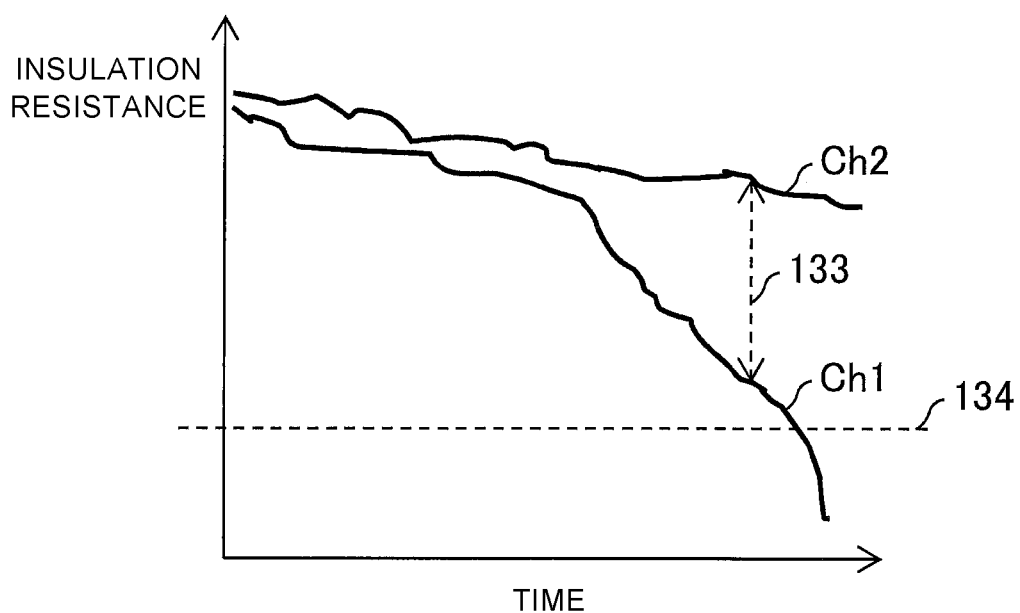

FIGS. 13A and 13B are diagrams illustrating an example of change of a calculated value of the insulation resistance-to-ground leakage current or the insulation resistance-to-ground over time for each three-phase motor 5 in the second embodiment of the invention. Changes of the respective insulation resistance-to-ground leakage currents of the three-phase motors 5a and 5b over time are illustrated in FIG. 13A. In the drawing, Ch1 corresponds to the three-phase motor 5a, and Ch2 corresponds to the three-phase motor 5b. On the other hand, changes of the respective insulation resistance-to-ground of the three-phase motors 5a and 5b over time are illustrated in FIG. 13B. In the drawing, Ch1 corresponds to the three-phase motor 5a, and Ch2 corresponds to the three-phase motor 5b. In the drawings, the change of the insulation resistance-to-ground leakage current or the insulation resistance-to-ground over time is different between the three-phase motors 5a and 5b. The leakage current calculation device 1 can appropriately specify the three-phase motor 5 which has deteriorated in insulation by comparing the values with each other or comparing each of the values with predetermined threshold values.

(Determination Based on Degree of Separation)

The determination part 19 can determine degrees of insulation deterioration in the three-phase motors 5a and 5b respectively by comparing the insulation resistance-to-ground leakage current corresponding to the system frequency of the three-phase motor 5a with the insulation resistance-to-ground leakage current corresponding to the system frequency of the three-phase motor 5b. For example, in the example illustrated in FIG. 13A, a large degree of separation 131 occurs between the insulation resistance-to-ground leakage current corresponding to the system frequency of the three-phase motor 5a at a certain time point and the insulation resistance-to-ground leakage current corresponding to the system frequency of the three-phase motor 5b at the same time point. When the degree of separation 131 has been detected, the determination part 19 determines that the three-phase motor 5a having a larger insulation resistance-to-ground leakage current has deteriorated in insulation.

(Determination Based on Threshold Value)

The determination part 19 may specify, among the three-phase motors 5a and 5b, the three-phase motor 5a of which the corresponding insulation resistance-to-ground leakage current is greater than a predetermined threshold value among the three-phase motors 5a and 5b as the three-phase motor 5a that has deteriorated in insulation. For example, in FIG. 13A, since the insulation resistance-to-ground leakage current of the three-phase motor 5a is greater than a threshold value 132 after a certain time point, the determination part 19 can specify that the three-phase motor 5a has deteriorated in insulation after the time point.

The determination using the degree of separation or the threshold value as described above may also be performed on the insulation resistance-to-ground of the three-phase motors 5a and 5b as illustrated in FIG. 13B in addition to the insulation resistance-to-ground leakage current. For example, in FIG. 13B, a large degree of separation 133 occurs between the insulation resistance-to-ground of the three-phase motor 5a at a certain time point and the insulation resistance-to-ground of the three-phase motor 5b at the same time point. When the degree of separation 133 has been detected, the determination part 19 determines that the three-phase motor 5a having a smaller insulation resistance-to-ground has deteriorated in insulation. In FIG. 13B, since the insulation resistance-to-ground of the three-phase motor 5a is less than a threshold value 134 after a certain time point, the determination part 19 can specify that the three-phase motor 5a has deteriorated in insulation after the time point.

Modified Examples

In a configuration in which the leakage current calculation device 1 includes a plurality of leakage current measuring parts 12, the leakage current measuring part 12 for measuring the leakage current of the three-phase motor 5 which is not monitored is not necessary. When the leakage current calculation device 1 includes the unnecessary leakage current measuring part 12, it causes an unnecessary increase in costs of the leakage current calculation device 1.

For the purpose of preventing this, the leakage current measuring parts 12 may be extension parts for measuring a leakage current. In this case, since a necessary number of leakage current measuring parts 12 can be attached to the leakage current calculation device 1 or an unnecessary leakage current measuring part 12 can be detached from the leakage current calculation device 1, it is possible to curb the cost of the leakage current calculation device 1. For example, a technique disclosed in Japanese Laid-open No. 2013-181813 can be used to implement the leakage current measuring part 12 as such an extension part.

Conclusion

In order to achieve the above-mentioned object, a leakage current calculation device according to a first aspect of the invention includes: a voltage measuring part that measures at least one of line voltages on an input side of an inverter with a three-phase AC commercial power system, in which one of three different phases is grounded, as a power source; a voltage-to-ground calculating part that calculates a voltage-to-ground between a neutral point of the commercial power system and the ground from the at least one line voltage measured by the voltage measuring part; a leakage current measuring part that measures a leakage current flowing between a load connected to an output side of the inverter and the ground; a frequency component extracting part that extracts a leakage current component synchronized with a system frequency of the commercial power system from the measured leakage current; a phase difference determining part that determines a phase difference between the calculated voltage-to-ground and the extracted leakage current component; and a leakage current calculating part that calculates an insulation resistance-to-ground leakage current corresponding to the system frequency, which flows through an insulation resistance-to-ground of the load between the load and the ground on the basis of a center of a circle which is drawn by specific points which are specified by the leakage current component and the phase difference which are extracted and determined at three or more different time points.

When the system frequency of the commercial power system and the operating frequency of the inverter are the same, the leakage current component extracted from the leakage current includes both the leakage current synchronized with the system frequency and the leakage current synchronized with the operating frequency. Since both frequencies are not strictly the same but are slightly different, the phase difference between the voltage-to-ground and the leakage current component becomes different at each measuring time point. Accordingly, the points which are defined by the leakage current components and the phase differences change at each measuring time point and describe a circle.

According to this configuration, the leakage current calculation device calculates the insulation resistance-to-ground leakage current corresponding to the system frequency which flows through the insulation resistance-to-ground of the load between the load and the ground on the basis of the center of the circle which is described by specific points specified by the leakage current component extracted and the phase difference calculated at three or more different time points. The center of the circle corresponds to an end point of a vector indicating the leakage current corresponding to the system frequency included in the leakage current component. Accordingly, the leakage current calculation device can accurately calculate the insulation resistance-to-ground leakage current in the leakage current corresponding to the system frequency on the basis of the center.

As described above, with the leakage current calculation device according to the first aspect of the invention, it is possible to accurately calculate the insulation resistance-to-ground leakage current corresponding to the system frequency when the system frequency of the commercial power system and the operating frequency of the inverter device are the same.

A leakage current calculation device according to a second aspect of the invention is the leakage current calculation device according to the first aspect, further including an insulation resistance calculating part that calculates an insulation resistance-to-ground of the load on the output side of the inverter on the basis of the calculated voltage-to-ground and the calculated insulation resistance-to-ground leakage current corresponding to the system frequency.

According to above configuration, it is possible to more accurately calculate the insulation resistance-to-ground of the load.

A leakage current calculation device according to a third aspect of the invention is the leakage current calculation device according to the first or second aspect, wherein the leakage current calculating part specifies the center of the circle on the basis of an equation of a circumscribed circle which circumscribes a triangle defined by three of the specific points.

According to the above configuration, it is possible to faster calculate the insulation resistance-to-ground leakage current corresponding to the system frequency.

A leakage current calculation device according to a fourth aspect of the invention is the leakage current calculation device according to the first or second aspect, wherein the leakage current calculating part specifies the center of the circle on the basis of a least squares method of the circle.

According to the above configuration, it is possible to more accurately calculate the insulation resistance-to-ground leakage current corresponding to the system frequency.

A leakage current calculation device according to a fifth aspect of the invention is the leakage current calculation device according to the first or second aspect, wherein, on the basis of the leakage current component extracted and the phase difference determined at each time point within a fixed time, the leakage current calculating part calculates the insulation resistance-to-ground leakage current the each time point and calculates a median value between a maximum value and a minimum value of the calculated values as the insulation resistance-to-ground leakage current corresponding to the system frequency.

According to the above configuration, it is possible to calculate the insulation resistance-to-ground leakage current corresponding to the system frequency without using complicated calculation.

A leakage current calculation device according to a sixth aspect of the invention is as follows. In the above first to fifth aspects, a plurality of the loads are separately connected to respective output sides of a plurality of the inverters, respectively, the input side of each of the plurality of the inverters is connected to the same commercial power system, the voltage measuring part measures at least one of the line voltages on the input side of any of the plurality of the inverters, the leakage current measuring part measures a plurality of the leakage currents respectively corresponding to the plurality of the loads, the frequency component extracting part extracts a plurality of the leakage current components respectively corresponding to the plurality of the loads from a plurality of the measured leakage currents, the phase difference determining part determines a plurality of phase differences on the basis of the calculated voltage-to-ground and the plurality of the extracted leakage current components, and the leakage current calculating part calculates a plurality of insulation resistance-to-ground leakage currents corresponding to the system frequency and respectively corresponding to the loads on the basis of centers of a plurality of circles respectively corresponding to the plurality of the loads.

According to the above configuration, the insulation resistance-to-ground leakage currents corresponding to the system frequency of a plurality of different loads can be calculated using a single leakage current calculation device. Since measurement of a voltage by the voltage measuring part may be performed on the input side of any of a plurality of inverters, the measurement of a voltage can be limited to one position. Accordingly, it is possible to simplify the configuration of the leakage current calculation device.

A leakage current calculation device according to a seventh aspect of the invention is the leakage current calculation device according to the sixth aspect, further including an insulation-deteriorated load specifying part that specifies the load of which the corresponding insulation resistance-to-ground leakage current corresponding to the system frequency is greater than a predetermined threshold value among the plurality of the loads as the load which has deteriorated in insulation.

According to the above configuration, it is possible to accurately specify a load which has deteriorated in insulation.

A leakage current calculation device according to an eighth aspect of the invention is the leakage current calculation device according to the sixth or seventh aspect, further including insulation deterioration determining part that determines degrees of insulation deterioration in a plurality of the loads respectively by comparing the plurality of the insulation resistance-to-ground leakage currents corresponding to the system frequency.

According to the above configuration, it is possible to accurately specify a load which has deteriorated in insulation.

In order to solve the above-mentioned problem, a leakage current calculation method according to a ninth aspect of the invention includes: a voltage measuring step of measuring at least one of line voltages on an input side of an inverter with a three-phase AC commercial power system, in which any of three different phases is grounded, as a power source; a voltage-to-ground calculating step of calculating a voltage-to-ground between a neutral point of the commercial power system and the ground from the measured at least one line voltage; a leakage current measuring step of measuring a leakage current flowing between a load connected to an output side of the inverter and the ground; a frequency component extracting step of extracting a leakage current component synchronized with a system frequency of the commercial power system from the measured leakage current; a phase difference determining step of determining a phase difference between the calculated voltage-to-ground and the extracted leakage current component; and a leakage current calculating step of calculating an insulation resistance-to-ground leakage current corresponding to the system frequency, which flows through an insulation resistance-to-ground of the load between the load and the ground on the basis of a center of a circle which is described by specific points which are specified by the leakage current component extracted and the phase difference determined at three or more different time points.

According to the above configuration, when the system frequency of the commercial power system and the operating frequency of the inverter device are the same, it is possible to accurately calculate the insulation resistance-to-ground leakage current corresponding to the system frequency.

The invention is not limited to the above-mentioned embodiments, and can be modified in various forms within the scope defined by the appended claims. Embodiments obtained by appropriately combining technical means respectively described in the different embodiments are included in the technical scope of the invention. New technical features may be created by combining the technical means respectively described in the embodiments.

What is claimed is:

1. A leakage current calculation device comprising:
a voltage measuring part that measures at least one of line voltages on an input side of an inverter with a three-phase AC commercial power system, in which any of three different phases is grounded, as a power source;
a voltage-to-ground calculating part that calculates a voltage-to-ground between a neutral point of the commercial power system and a ground from the at least one line voltage measured by the voltage measuring part;
a leakage current measuring part that measures a leakage current flowing between a load connected to an output side of the inverter and the ground;
a frequency component extracting part that extracts a leakage current component synchronized with a system frequency of the commercial power system from the measured leakage current;
a phase difference determining part that determines a phase difference between the calculated voltage-to-ground and the extracted leakage current component; and
a leakage current calculating part that calculates an insulation resistance-to-ground leakage current corresponding to the system frequency, which flows through an insulation resistance-to-ground of the load between the load and the ground on the basis of a center of a circle which is described by specific points which are specified by the leakage current component extracted and the phase difference determined at three or more different time points.

2. The leakage current calculation device according to claim 1, further comprising an insulation resistance calculating part that calculates an insulation resistance-to-ground on the output side of the inverter on the basis of the calculated voltage-to-ground and the calculated insulation resistance-to-ground leakage current corresponding to the system frequency.

3. The leakage current calculation device according to claim 1, wherein the leakage current calculating part specifies the center of the circle on the basis of an equation of the circle which circumscribes a triangle defined by three of the specific points.

4. The leakage current calculation device according to claim 1, wherein the leakage current calculating part specifies the center of the circle on the basis of a least squares method of the circle.

5. The leakage current calculation device according to claim 1, wherein, on the basis of the leakage current component extracted and the phase difference determined at each time point within a fixed time, the leakage current calculating part calculates the insulation resistance-to-ground leakage current at the each time point and calculates a median value between a maximum value and a minimum value of the calculated insulation resistance-to-ground leakage current (Iu, Iv, Iw) at the each time point as the insulation resistance-to-ground leakage current corresponding to the system frequency.

6. The leakage current calculation device according to claim 1, wherein a plurality of the loads are separately connected to respective output sides of a plurality of the inverters, respectively,
wherein the input side of each of the plurality of the inverters is connected to a same commercial power system,
wherein the voltage measuring part measures at least one of the line voltages on the input side of any of the plurality of the inverters,
wherein the leakage current measuring part measures a plurality of the leakage currents respectively corresponding to the plurality of the loads,
wherein the frequency component extracting part extracts a plurality of the leakage current components respectively corresponding to the plurality of the loads from a plurality of the measured leakage currents,
wherein the phase difference determining part determines a plurality of the phase differences on the basis of the calculated voltage-to-ground and the plurality of the extracted leakage current components, and
wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

7. The leakage current calculation device according to claim 6, further comprising an insulation-deteriorated load specifying part that specifies the load of which the corresponding insulation resistance-to-ground leakage current corresponding to the system frequency is greater than a predetermined threshold value among the plurality of loads as the load which has deteriorated in insulation.

8. The leakage current calculation device according to claim 6, further comprising an insulation deterioration determining part that determines degrees of insulation deterioration in the plurality of the loads respectively by comparing the plurality of insulation resistance-to-ground leakage currents corresponding to the system frequency.

9. The leakage current calculation device according to claim 2, wherein the leakage current calculating part specifies the center of the circle on the basis of an equation of the circle which circumscribes a triangle defined by three of the specific points.

10. The leakage current calculation device according to claim 2, wherein the leakage current calculating part specifies the center of the circle on the basis of a least squares method of the circle.

11. The leakage current calculation device according to claim 2, wherein, on the basis of the leakage current component extracted and the phase difference determined at each time point within a fixed time, the leakage current calculating part calculates the insulation resistance-to-ground leakage current at the each time point and calculates a median value between a maximum value and a minimum value of the calculated insulation resistance-to-ground leakage current (Iu, Iv, Iw) at the each time point as the insulation resistance-to-ground leakage current corresponding to the system frequency.

12. The leakage current calculation device according to claim 2, wherein a plurality of the loads are separately connected to respective output sides of a plurality of the inverters, respectively,
 wherein the input side of each of the plurality of the inverters is connected to a same commercial power system,
 wherein the voltage measuring part measures at least one of the line voltages on the input side of any of the plurality of the inverters,
 wherein the leakage current measuring part measures a plurality of the leakage currents respectively corresponding to the plurality of the loads,
 wherein the frequency component extracting part extracts a plurality of the leakage current components respectively corresponding to the plurality of the loads from a plurality of the measured leakage currents,
 wherein the phase difference determining part determines a plurality of the phase differences on the basis of the calculated voltage-to-ground and the plurality of the extracted leakage current components, and
 wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

13. The leakage current calculation device according to claim 3, wherein a plurality of the loads are separately connected to respective output sides of a plurality of the inverters, respectively,
 wherein the input side of each of the plurality of the inverters is connected to a same commercial power system,
 wherein the voltage measuring part measures at least one of the line voltages on the input side of any of the plurality of the inverters,
 wherein the leakage current measuring part measures a plurality of the leakage currents respectively corresponding to the plurality of the loads,
 wherein the frequency component extracting part extracts a plurality of the leakage current components respectively corresponding to the plurality of the loads from a plurality of the measured leakage currents,
 wherein the phase difference determining part determines a plurality of the phase differences on the basis of the calculated voltage-to-ground and the plurality of the extracted leakage current components, and
 wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

14. The leakage current calculation device according to claim 4, wherein a plurality of the loads are separately connected to respective output sides of a plurality of the inverters, respectively,
 wherein the input side of each of the plurality of the inverters is connected to a same commercial power system,
 wherein the voltage measuring part measures at least one of the line voltages on the input side of any of the plurality of the inverters,
 wherein the leakage current measuring part measures a plurality of the leakage currents respectively corresponding to the plurality of the loads,
 wherein the frequency component extracting part extracts a plurality of the leakage current components respectively corresponding to the plurality of the loads from a plurality of the measured leakage currents,
 wherein the phase difference determining part determines a plurality of the phase differences on the basis of the calculated voltage-to-ground and the plurality of the extracted leakage current components, and
 wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

15. The leakage current calculation device according to claim 5, wherein a plurality of the loads are separately connected to respective output sides of a plurality of the inverters, respectively,
 wherein the input side of each of the plurality of the inverters is connected to a same commercial power system,
 wherein the voltage measuring part measures at least one of the line voltages on the input side of any of the plurality of the inverters,
 wherein the leakage current measuring part measures a plurality of the leakage currents respectively corresponding to the plurality of the loads,
 wherein the frequency component extracting part extracts a plurality of the leakage current components respectively corresponding to the plurality of the loads from a plurality of the measured leakage currents,
 wherein the phase difference determining part determines a plurality of the phase differences on the basis of the calculated voltage-to-ground and the plurality of the extracted leakage current components, and
 wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

16. The leakage current calculation device according to claim 9, wherein a plurality of the loads are separately connected to respective output sides of a plurality of the inverters, respectively,
 wherein the input side of each of the plurality of the inverters is connected to a same commercial power system,
 wherein the voltage measuring part measures at least one of the line voltages on the input side of any of the plurality of the inverters,
 wherein the leakage current measuring part measures a plurality of the leakage currents respectively corresponding to the plurality of the loads,
 wherein the frequency component extracting part extracts a plurality of the leakage current components respectively corresponding to the plurality of the loads from a plurality of the measured leakage currents,
 wherein the phase difference determining part determines a plurality of the phase differences on the basis of the calculated voltage-to-ground and the plurality of the extracted leakage current components, and wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

17. The leakage current calculation device according to claim 10, wherein a plurality of the loads are separately connected to respective output sides of a plurality of the inverters, respectively, wherein the input side of each of the plurality of the inverters is connected to a same commercial power system, wherein the voltage measuring part measures at least one of the line voltages on the input side of any of the plurality of the inverters, wherein the leakage current measuring part measures a plurality of the leakage currents respectively corresponding to the plurality of the loads, wherein the frequency component extracting part extracts a plurality of the leakage current components respectively corresponding to the plurality of the loads from a plurality of the measured leakage currents, wherein the phase difference determining part determines a plurality of the phase differences on the basis of the calculated voltage-to-ground and the plurality of the extracted leakage current components, and wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

18. The leakage current calculation device according to claim 11, wherein a plurality of the loads are separately connected to respective output sides of a plurality of the inverters, respectively, wherein the input side of each of the plurality of the inverters is connected to a same commercial power system, wherein the voltage measuring part measures at least one of the line voltages on the input side of any of the plurality of the inverters, wherein the leakage current measuring part measures a plurality of the leakage currents respectively corresponding to the plurality of the loads, wherein the frequency component extracting part extracts a plurality of the leakage current components respectively corresponding to the plurality of the loads from a plurality of the measured leakage currents, wherein the phase difference determining part determines a plurality of the phase differences on the basis of the calculated voltage-to-ground and the plurality of the extracted leakage current components, and wherein the leakage current calculating part calculates a plurality of the insulation resistance-to-ground leakage currents corresponding to the system frequency and respectively corresponding to the loads on the basis of centers of a plurality of the circles respectively corresponding to the plurality of the loads.

19. The leakage current calculation device according to claim 7, further comprising an insulation deterioration determining part that determines degrees of insulation deterioration in the plurality of the loads respectively by comparing the plurality of insulation resistance-to-ground leakage currents corresponding to the system frequency.

20. A leakage current calculation method comprising:
a voltage measuring step of measuring at least one of line voltages on an input side of an inverter with a three-phase AC commercial power system, in which any of three different phases is grounded, as a power source;
a voltage-to-ground calculating step of calculating a voltage-to-ground between a neutral point of the commercial power system and a ground from the measured at least one line voltage;
a leakage current measuring step of measuring a leakage current flowing between a load connected to an output side of the inverter and the ground;
a frequency component extracting step of extracting a leakage current component synchronized with a system frequency of the commercial power system from the measured leakage current;
a phase difference determining step of determining a phase difference between the calculated voltage-to-ground and the extracted leakage current component; and
a leakage current calculating step of calculating an insulation resistance-to-ground leakage current corresponding to the system frequency, which flows through an insulation resistance-to-ground of the load between the load and the ground on the basis of a center of a circle which is described by specific points which are specified by the leakage current component extracted and the phase difference determined at three or more different time points.

* * * * *